(12) United States Patent
Tanaka

(10) Patent No.: US 8,183,690 B2
(45) Date of Patent: May 22, 2012

(54) ELECTRONIC DEVICE

(75) Inventor: Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 186 days.

(21) Appl. No.: 12/187,757

(22) Filed: Aug. 7, 2008

(65) Prior Publication Data

US 2009/0045509 A1    Feb. 19, 2009

(30) Foreign Application Priority Data

Aug. 13, 2007  (JP) ................................. 2007-210877

(51) Int. Cl.
*H01L 23/48* (2006.01)

(52) U.S. Cl. ................................. 257/737; 257/E23.01

(58) Field of Classification Search .................. 257/737, 257/E23.01
See application file for complete search history.

(56) References Cited

U.S. PATENT DOCUMENTS

| 5,641,839 | A * | 6/1997 | Asano et al. .................. 525/480 |
| 6,756,685 | B2 | 6/2004 | Tao |
| 7,034,404 | B1 * | 4/2006 | Harada et al. ................. 257/788 |
| 7,348,269 | B2 | 3/2008 | Tanaka et al. |
| 2005/0110168 | A1 * | 5/2005 | Chuang ......................... 257/788 |
| 2007/0007651 | A1 | 1/2007 | Hashimoto |
| 2008/0029294 | A1 * | 2/2008 | Kawamura et al. ........... 174/261 |

FOREIGN PATENT DOCUMENTS

| CN | 1897261 | 1/2007 |
| JP | 02-272737 | 11/1990 |
| JP | 2744476 | 3/1991 |
| JP | 2731471 | 6/1993 |
| JP | 95039146 | * 5/1995 |
| JP | 2000-174063 | 6/2000 |
| JP | 2003-051568 | 2/2003 |
| JP | 2004-179292 | 6/2004 |
| JP | 2005-101527 | * 4/2005 |
| JP | 2006-196570 | 7/2006 |
| JP | 2007-180166 | 7/2007 |

OTHER PUBLICATIONS

Julian Norley et al., High performance, lightweight Graphite Heat Sinks/ Spreaders, May 14, 2002, IEEE.*

* cited by examiner

*Primary Examiner* — Evan Pert
*Assistant Examiner* — Hajar Kolahdouzan
(74) *Attorney, Agent, or Firm* — Harness, Dickey & Pierce, P.L.C.

(57) ABSTRACT

An electronic device including: a semiconductor chip on which an integrated circuit is formed; an electrode formed on the semiconductor chip and electrically connected to the integrated circuit; a resin protrusion disposed on the semiconductor chip; an interconnect formed on the electrode and extending over the resin protrusion; a wiring board on which a wiring pattern is formed, the semiconductor chip being mounted on the wiring board so that part of the interconnect positioned over the resin protrusion faces and is electrically connected to the wiring pattern; and an adhesive that bonds the semiconductor chip and the wiring board. The resin protrusion is compressed in a direction in which the distance between the semiconductor chip and the wiring board decreases and is formed of a material having a negative coefficient of thermal expansion.

7 Claims, 4 Drawing Sheets

ELECTRONIC DEVICE

Japanese Patent Application No. 2007-210877, filed on Aug. 13, 2007, is hereby incorporated by reference in its entirety.

BACKGROUND OF THE INVENTION

The present invention relates to an electronic device.

JP-A-2-272737 discloses technology that forms a resin protrusion on an active surface of a semiconductor chip, and forms an interconnect from an electrode on the active surface to extend over the resin protrusion to form a bump electrode. According to this technology, stress can be reduced by the resin protrusion while providing the bump electrodes at a pitch and an arrangement differing from those of the electrodes. Japanese Patent No. 2744476 discloses technology that mounts a semiconductor device having bump electrodes on a wiring board utilizing an electrically insulating adhesive. When the semiconductor device is mounted on the circuit board, a resin protrusion under the bump electrode is compressed between the semiconductor chip and the wiring board, and an interconnect of the bump electrode comes in contact with a wiring pattern of the wiring board under pressure due to the elasticity of the resin protrusion. This enables the bump electrode and the wiring pattern to be stably connected even if the bump electrodes formed on the semiconductor chip differ in height or the substrate is warped.

Japanese Patent No. 2731471 discloses a structure in which an adhesive and a resin protrusion have an identical coefficient of linear expansion. However, the structure disclosed in Japanese Patent No. 2731471 is not suitable for practical applications since only limited materials can be used. JP-A-2005-101527 discloses technology that maintains the compressed state of a resin protrusion when an adhesive expands due to heat, even if the coefficient of linear expansion of the resin protrusion is greater than that of the adhesive, by compressing the resin protrusion to an extent greater than the difference in the amount of expansion between the resin protrusion and the adhesive when the resin protrusion and the adhesive are heated, thereby maintaining electrical connection utilizing the bump electrode.

However, since the glass transition temperature of the adhesive is lower than that of the resin protrusion, the adhesive softens earlier than the resin protrusion. In this case, the compressed resin protrusion expands due to the thermal expansion of the resin protrusion and the repulsive force against compression. Therefore, the resin protrusion almost completely recovers its original shape so that the pressure contact state of the resin protrusion cannot be maintained. This makes it impossible to ensure electrical connection.

SUMMARY

According to one aspect of the invention, there is provided an electronic device comprising:

a semiconductor chip on which an integrated circuit is formed;

an electrode formed on the semiconductor chip and electrically connected to the integrated circuit;

a resin protrusion disposed on the semiconductor chip;

an interconnect formed on the electrode and extending over the resin protrusion;

a wiring board on which a wiring pattern is formed, the semiconductor chip being mounted on the wiring board so that part of the interconnect positioned over the resin protrusion faces and is electrically connected to the wiring pattern; and an adhesive that bonds the semiconductor chip and the wiring board, the resin protrusion being compressed in a direction in which the distance between the semiconductor chip and the wiring board decreases and being formed of a material having a negative coefficient of thermal expansion.

DETAILED DESCRIPTION OF THE EMBODIMENT

The invention may prevent an electrical connection failure due to thermal expansion.

(1) According to one embodiment of the invention, there is provided an electronic device comprising:

a semiconductor chip on which an integrated circuit is formed;

an electrode formed on the semiconductor chip and electrically connected to the integrated circuit;

a resin protrusion disposed on the semiconductor chip;

an interconnect formed on the electrode and extending over the resin protrusion;

a wiring board on which a wiring pattern is formed, the semiconductor chip being mounted on the wiring board so that part of the interconnect positioned over the resin protrusion faces and is electrically connected to the wiring pattern; and an adhesive that bonds the semiconductor chip and the wiring board, the resin protrusion being compressed in a direction in which the distance between the semiconductor chip and the wiring board decreases and being formed of a material having a negative coefficient of thermal expansion.

According to this embodiment, since the resin protrusion has a negative coefficient of thermal expansion, the resin protrusion shrinks when heated. Therefore, even if the compressive force applied to the resin protrusion is canceled when the adhesive softens due to heat so that the resin protrusion recovers its original shape, a tensile stress (i.e., a force that increases the distance between the semiconductor chip and the substrate) that occurs in the adhesive between the semiconductor chip and the substrate decreases due to shrinkage of the resin protrusion. Specifically, expansion of the adhesive that has softened can be suppressed so that the compressed state of the resin protrusion is maintained. This prevents an electrical connection failure due to thermal expansion.

(2) In this electronic device, the resin protrusion may have a negative coefficient of thermal expansion in at least a temperature range between 25° C. and the glass transition temperature of the adhesive.

(3) In this electronic device, the resin protrusion may be formed of one of a liquid crystal polymer, polyparaphenylenebenzoxazole, and polyimidebenzoxazole.

(4) In this electronic device, the resin protrusion may be formed of a mixed resin prepared by dispersing elastic rubber particles in a phenol novolac curing agent and a polyfunctional epoxy resin.

Figure 1:
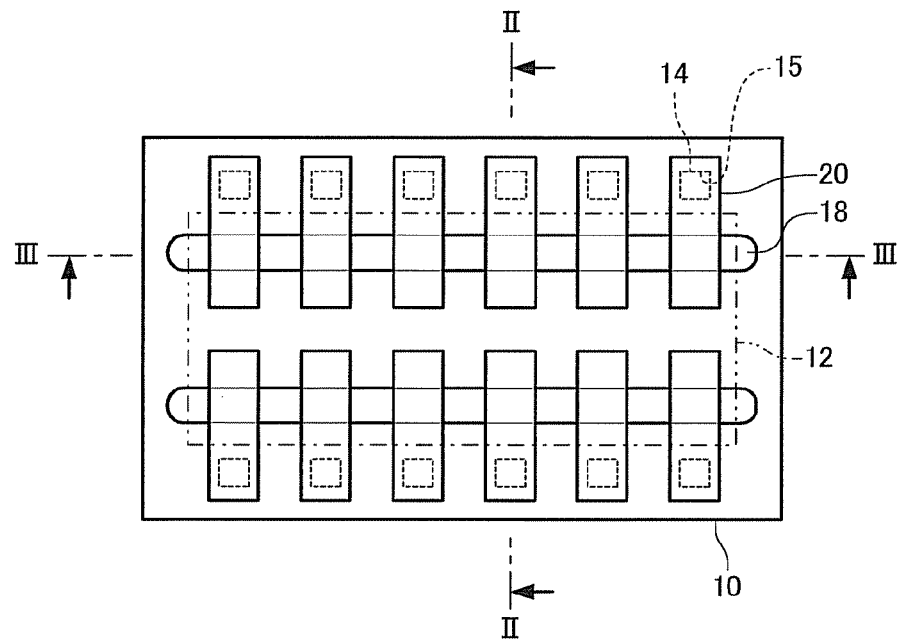
FIG. 1 is a plan view showing a semiconductor device used for an electronic device according to one embodiment of the invention.
Figure 2:
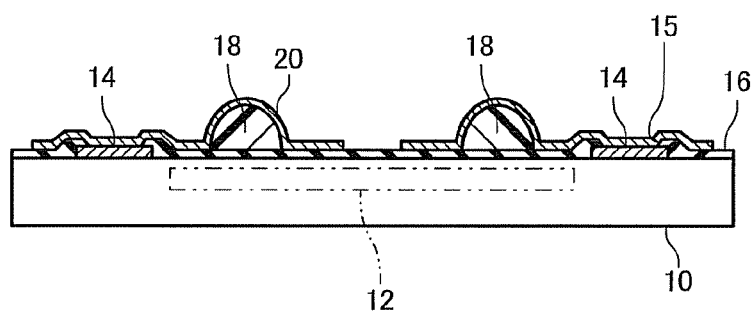
FIG. 2 is a cross-sectional view of the semiconductor device shown in FIG. 1 taken along the line II-II.
Figure 3:
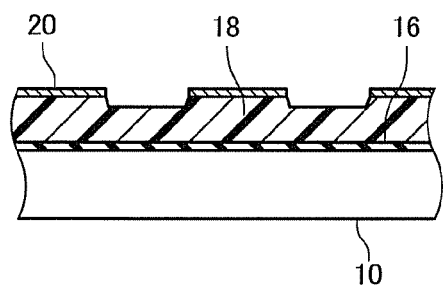
FIG. 3 is a cross-sectional view of the semiconductor device shown in FIG. 1 taken along the line III-III.

FIG. 1 is a plan view showing a semiconductor device used for an electronic device according to one embodiment of the invention. FIG. 2 is a cross-sectional view of the semiconductor device shown in FIG. 1 taken along the line II-II. FIG. 3 is a cross-sectional view of the semiconductor device shown in FIG. 1 taken along the line III-III.

The semiconductor device includes a semiconductor chip 10. An integrated circuit (e.g., transistor) 12 is formed on the semiconductor chip 10. The semiconductor chip 10 includes electrodes 14 electrically connected to the integrated circuit 12 through internal interconnects (not shown). The semiconductor chip 10 has a shape of which the dimension in one direction is longer than that in the direction that intersects the one direction (i.e., has a rectangular planar shape), and the electrodes 14 are arranged along the long side. A passivation film 16 (i.e., protective film) having openings 15 is formed on the semiconductor chip 10 so that the electrodes 14 are at least partially exposed. The passivation film 16 may be formed only of an inorganic material (e.g., $SiO_2$ or $SiN$), for example. The passivation film 16 is formed over the integrated circuit 12.

A resin protrusion 18 is formed on the passivation film 16. The electrodes 14 are formed along the edge of the semiconductor chip 10, and the resin protrusion 18 is formed at a position closer to the center of the semiconductor chip 10 than the electrodes 14. The coefficient of thermal expansion (coefficient of linear expansion) of the resin protrusion 18 is negative in at least a temperature range between 25° C. and the glass transition temperature (e.g., 120° C.) of an adhesive 42 (see FIGS. 5A and 5B). Specifically, the resin protrusion 18 shrinks in this temperature range along with an increase in temperature. The material for the resin protrusion 18 may be a liquid crystal polymer, polyparaphenylenebenzoxazole, polyimidebenzoxazole, or a mixed resin prepared by dispersing elastic rubber particles in a phenol novolac curing agent and a polyfunctional epoxy resin, for example.

A plurality of interconnects 20 are respectively formed from the electrodes 14 to extend over the resin protrusion 18. The interconnect 20 is electrically connected to the electrode 14 and is formed over the resin protrusion 18. The interconnect 20 is formed from the electrode 14 to extend over the resin protrusion 20 through the passivation film 16. The interconnect 20 is electrically connected to the electrode 14 over the electrode 14. The interconnect 20 may directly come in contact with the electrode 14, or a conductive film (not shown) may be provided between the interconnect 20 and the electrode 14. The interconnect 20 extends beyond the edge of the resin protrusion 18 opposite to the electrode 14 and then extends over the passivation film 16. The interconnect 20 extends from the electrode 14 disposed at (near) the edge of the semiconductor chip 10 toward the center of the semiconductor chip 10.

The upper side of the resin protrusion 18 is formed so that the areas that do not overlap the interconnects 20 are lower than the areas that overlap the interconnects 20 (see FIG. 3). After forming the interconnects 20 over the resin protrusion 18, the resin protrusion 18 may be etched in the areas between the adjacent interconnects 20.

Figure 4A:
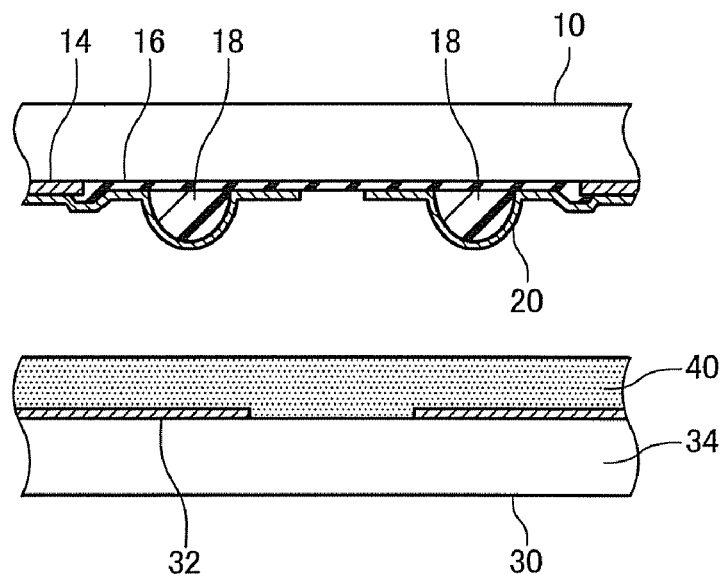
FIGS. 4A and 4B are explanatory views illustrative of a method of producing an electronic device according to an embodiment of the invention.
Figure 4B:
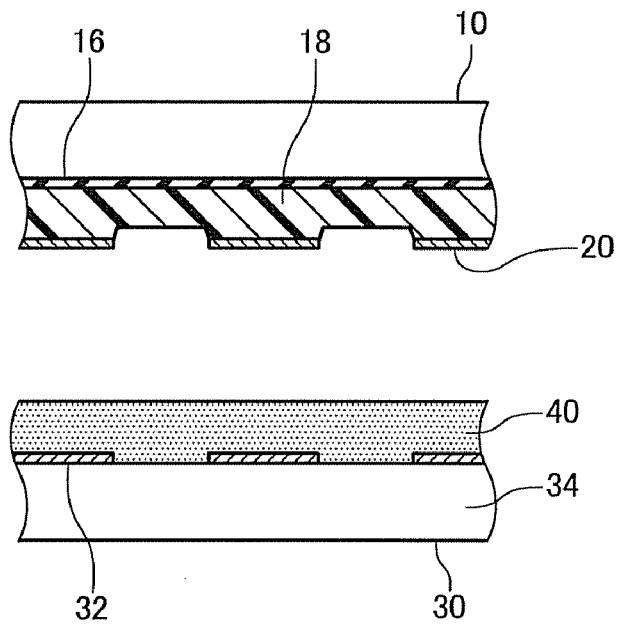

FIGS. 4A and 4B are explanatory views illustrative of a method of producing an electronic device according to one embodiment of the invention. Note that the semiconductor device shown in FIG. 4A corresponds to the cross section along the line II-II in FIG. 1 (FIG. 2), and the semiconductor device shown in FIG. 4B corresponds to the cross section along the line III-III in FIG. 1 (FIG. 3).

In this embodiment, the above-described semiconductor device is disposed on a wiring board 30 having a wiring pattern 32 through a heat-curable adhesive precursor 40. The wiring board 30 may be a liquid crystal panel or an organic EL panel. A substrate 34 that supports the wiring pattern 32 may be formed of glass or a resin. An anisotropic conductive material in which conductive particles are dispersed may be used as the adhesive precursor 40. A pressing force and heat are applied to the semiconductor device and the wiring board 30. The adhesive precursor 40 is applied to the resin protrusion 18 in the areas between the adjacent interconnects 20. The adhesive precursor 40 is then cured and shrunk by applying heat. A pressing force is continuously applied until the adhesive precursor 40 is cured. A pressing force is removed when the adhesive precursor 40 has been cured. An electronic device is produced in this manner.

Figure 5A:
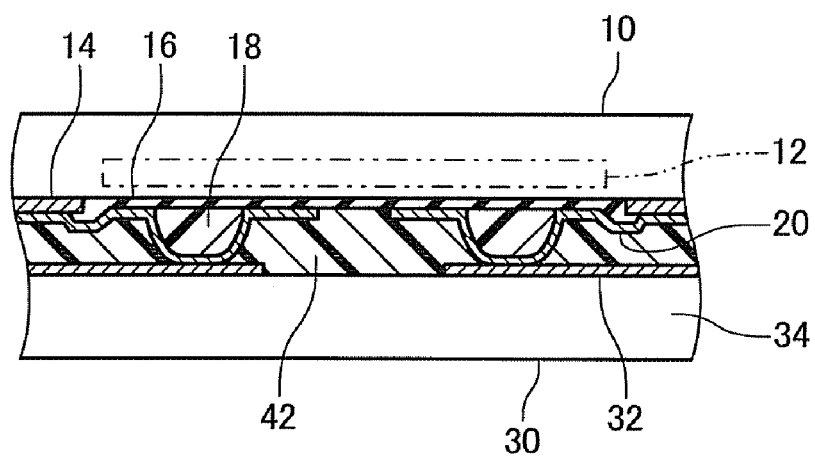
FIGS. 5A and 5B are explanatory views illustrative of an electronic device according to one embodiment of the invention.
Figure 5B:
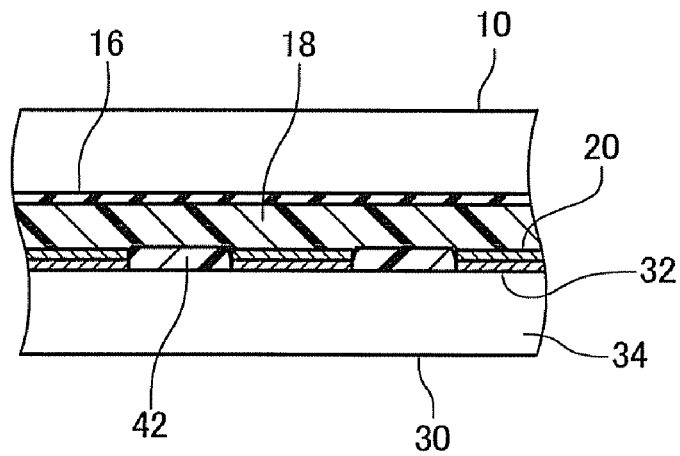

FIGS. 5A and 5B are explanatory views illustrative of an electronic device according to one embodiment of the invention. Note that the semiconductor device shown in FIG. 5A corresponds to the cross section along the line II-II in FIG. 1 (FIG. 2), and the semiconductor device shown in FIG. 5B corresponds to the cross section along the line III-III in FIG. 1 (FIG. 3).

The electronic device includes the above-described semiconductor device, and the wiring board 30 having the wiring pattern 32 electrically connected to the areas of the interconnects 20 positioned over the resin protrusion 18. An adhesive 42 that has been cured is positioned between the semiconductor chip 10 and the wiring board 30. The adhesive 42 contains a residual stress due to shrinkage during curing. The adhesive 42 is partially positioned between the wiring board 30 and the areas of the resin protrusion 18 between the adjacent interconnects 20.

The resin protrusion 18 is compressed in the direction in which the distance between the semiconductor chip 10 and the wiring board 30 decreases. The resin protrusion 18 is formed of a material having a negative coefficient of thermal expansion. The coefficient of thermal expansion of the resin protrusion 18 is negative in at least a temperature range between 25° C. and the glass transition temperature (e.g., 120° C.) of the adhesive. According to this embodiment, since the resin protrusion 18 has a negative coefficient of thermal expansion, the resin protrusion 18 shrinks when heated. Therefore, even if the compressive force applied to the resin protrusion 18 is canceled when the adhesive 42 softens due to heat so that the resin protrusion 18 recovers its original shape, a tensile stress (i.e., a force that increases the distance between the semiconductor chip 10 and the substrate 34) that occurs in the adhesive 42 between the semiconductor chip 10 and the substrate 34 decreases due to shrinkage of the resin protrusion 18. Specifically, expansion of the adhesive 42 that has softened can be suppressed so that the compressed state of the resin protrusion 18 is maintained. In other words, the repulsive force (i.e., a force that expands the adhesive 42) of the resin protrusion 18 occurs due to the elastic force of the resin protrusion 18 and the thermal expansion of the resin protrusion 18. In this embodiment, since the resin protrusion 18 has a negative coefficient of thermal expansion, the resultant repulsive force of the resin protrusion 18 can be reduced. This prevents an electrical connection failure due to thermal expansion.

Figure 6:
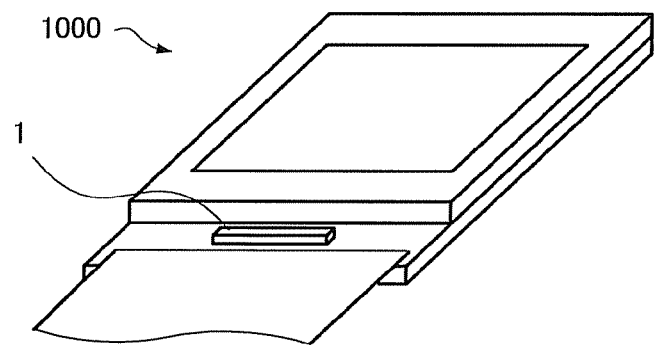
FIG. 6 is a perspective view illustrative of an electronic device using a semiconductor device according to one embodiment of the invention.

FIG. 6 is a perspective view illustrative of an electronic device 1000 using a semiconductor device according to one embodiment of the invention.

Figure 7:
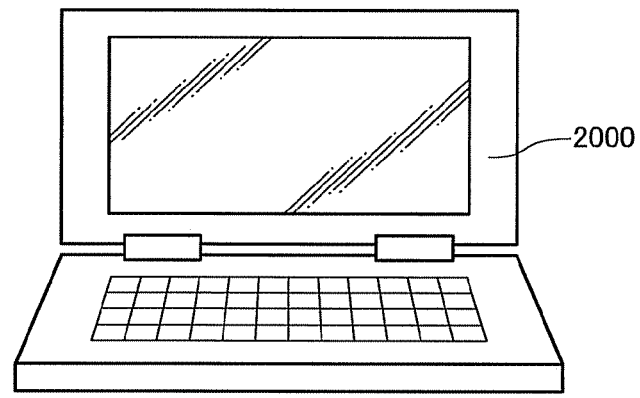
FIG. 7 is a perspective view illustrative of another electronic device using a semiconductor device according to one embodiment of the invention.

FIG. 7 is a perspective view illustrative of another electronic device 2000 using a semiconductor device according to one embodiment of the invention.

Figure 8:
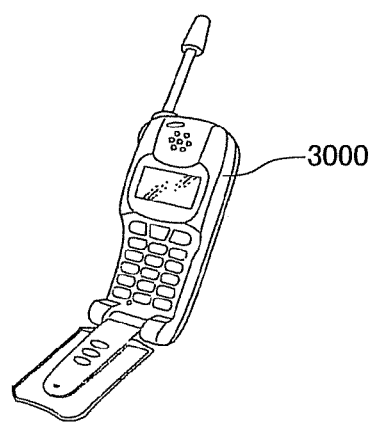
FIG. 8 is a perspective view illustrative of yet another electronic device using a semiconductor device according to one embodiment of the invention.

FIG. 8 is a perspective view illustrative of yet another electronic device 3000 using a semiconductor device according to one embodiment of the invention.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. An electronic device comprising:
   a semiconductor chip on which an integrated circuit is formed, the semiconductor chip having a rectangular shape with a pair of long sides and a pair of short sides;
   an electrode formed on the semiconductor chip and electrically connected to the integrated circuit;
   a resin protrusion disposed on the semiconductor chip;
   an interconnect formed on the electrode and extending over the resin protrusion;
   a wiring board on which a wiring pattern is formed, the semiconductor chip being mounted on the wiring board so that part of the interconnect positioned over the resin protrusion is electrically connected to the wiring pattern; and
   an adhesive that bonds the semiconductor chip and the wiring board,
   the electrodes being arranged along the long sides of the semiconductor chip,
   the resin protrusion being formed of a resin including elastic rubber particles dispersed in a material, and
   the resin protrusion having a negative coefficient of thermal expansion and the resin protrusion having a shape extending along the arrangement direction of the electrodes.

2. The electronic device as defined in claim 1,
   the resin protrusion having a negative coefficient of thermal expansion in at least a temperature range between 25° C. and the glass transition temperature of the adhesive.

3. The electronic device as defined in claim 1,
   the resin protrusion being formed of a mixed resin including the elastic rubber particles dispersed in a phenol novolac curing agent and a polyfunctional epoxy resin.

4. The electronic device as defined in claim 1,
   the resin protrusion being compressed in a direction in which a distance between the semiconductor chip and the wiring board decreases.

5. The electronic device as defined in claim 1,
   the resin protrusion being etched in areas between adjacent interconnects.

6. An electronic device comprising:
   a semiconductor chip on which an integrated circuit is formed, the semiconductor chip having a rectangular shape with a pair of long sides and a pair of short sides;
   an electrode formed on the semiconductor chip and electrically connected to the integrated circuit;
   a resin protrusion disposed on the semiconductor chip;
   an interconnect formed on the electrode and extending over the resin protrusion;
   a wiring board on which a wiring pattern is formed, the semiconductor chip being mounted on the wiring board so that part of the interconnect positioned over the resin protrusion is electrically connected to the wiring pattern; and
   an adhesive that bonds the semiconductor chip and the wiring board,
   the electrodes being arranged along the long sides of the semiconductor chip,
   the resin protrusion being formed of a resin including elastic rubber particles dispersed in a material,
   the resin protrusion having a negative coefficient of thermal expansion and the resin protrusion having a shape extending along the arrangement direction of the electrodes, and
   the resin protrusion having a negative coefficient of thermal expansion in at least a temperature range between 25° C. and the glass transition temperature of the adhesive.

7. An electronic device comprising:
   a semiconductor chip on which an integrated circuit is formed, the semiconductor chip having a rectangular shape with a pair of long sides and a pair of short sides;
   an electrode formed on the semiconductor chip and electrically connected to the integrated circuit;
   a resin protrusion disposed on the semiconductor chip;
   an interconnect formed on the electrode and extending over the resin protrusion;
   a wiring board on which a wiring pattern is formed, the semiconductor chip being mounted on the wiring board so that part of the interconnect positioned over the resin protrusion is electrically connected to the wiring pattern; and
   an adhesive that bonds the semiconductor chip and the wiring board,
   the electrodes being arranged along the long sides of the semiconductor chip,
   the resin protrusion being formed of a resin including elastic rubber particles dispersed in a material, the resin protrusion having a negative coefficient of thermal expansion and the resin protrusion having a shape extending along the arrangement direction of the electrodes, and the resin protrusion being etched in areas between adjacent interconnects.

* * * * *